(12) United States Patent
Hinds

(10) Patent No.: US 6,225,692 B1
(45) Date of Patent: May 1, 2001

(54) FLIP CHIP PACKAGE FOR MICROMACHINED SEMICONDUCTORS

(75) Inventor: Ronald L. Hinds, Otterbein, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/325,282

(22) Filed: Jun. 3, 1999

(51) Int. Cl.$^7$ .............................. H01L 23/48; H01L 23/06
(52) U.S. Cl. ..................... 257/698; 257/703; 257/700; 257/693; 361/795
(58) Field of Search ................................... 257/698, 700, 257/703, 705, 685, 686, 693; 361/795, 536; 438/109

(56) References Cited

U.S. PATENT DOCUMENTS

| | | | |
|---|---|---|---|
| 5,369,057 | 11/1994 | Lee | 438/51 |
| 5,585,675 | * 12/1996 | Knopf | 257/774 |
| 5,663,596 | * 9/1997 | Little | 257/727 |
| 5,721,162 | 2/1998 | Schubert | 438/52 |
| 5,831,162 | 11/1998 | Sparks | 72/493 |
| 5,907,187 | * 5/1999 | Koiwa et al. | 257/737 |
| 6,087,203 | * 7/2000 | Eng et al. | 438/118 |

* cited by examiner

Primary Examiner—Eddie C. Lee
Assistant Examiner—Jhihan B Clark
(74) Attorney, Agent, or Firm—Mark P. Bourgeois; Mark W. Borgman

(57) ABSTRACT

A hermetic multilayered ceramic semiconductor package for micromachined semiconductor devices. A low temperature co-fired ceramic assembly has a cavity and a top and bottom surface. Several vias extend between the top and bottom surfaces and several solder spheres are located on the top surface and are electrically connected to the vias. A micromachined semiconductor device abuts the bottom surface and covers the cavity such that a movable portion of the micromachined semiconductor device is unconstrained to move within the cavity. Solder is used to connect the vias to solder bumps on the semiconductor device. A seal ring is located between the micromachined semiconductor device and the ceramic assembly for hermetically sealing the micromachined semiconductor device.

4 Claims, 4 Drawing Sheets

FLIP CHIP PACKAGE FOR MICROMACHINED SEMICONDUCTORS

BACKGROUND OF THE PREFERRED EMBODIMENT(S)

1. Field of the Preferred Embodiment(s)

This invention generally relates to ceramic electronic packaging. Specifically, there is a multilayered ceramic package having a cavity that is bonded to a micromachined semiconductor device.

2. Description of the Related Art

Various devices and techniques are used for packaging of micromachined semiconductor devices. Typically, a micromachined semiconductor die is fabricated with wirebond pads and a sealing structure. A silicon lid has a cavity etched therein using a strong acid such as hydrofluoric. The micromachined semiconductor needs space within the package to allow the moving surfaces of the device to function properly. The silicon lid can be attached to the semiconductor die by an adhesive. The die and lid assembly is placed on a hybrid ceramic where the bond pads on the die are wirebonded to bond pads on the hybrid ceramic. The hybrid ceramic is then encapsulated within a hermetic package. This package has several problems. First, wire bonds are fragile and are subject to being torn away during mechanical assembly of the package. Second, the ceramic hybrid is expensive to produce. Third, if one of the parts in the hybrid circuit is defective, the whole circuit has to be thrown away. Previous attempts at packaging micromachined semiconductor devices have encountered difficulties in producing reliable electrical connections and hermetic seals that will survive environmental stress and be economically manufactured.

Typical micro-machined semiconductor structures contain metal elements on their surfaces which cannot be passivated through traditional glass passivation processes, however they still must be hermetically sealed. Current techniques include "attaching" a silicon lid, which has a cavity etched into its underside to clear the micro-machined structure, to the surface of the die exposing only the bonding pads. This configuration accomplishes the hermetic seal but will not allow for flip chip processes to be used as the die I/O pads cannot be brought to the surface.

Despite the advantages of the prior art designs, none have combined a highly reliable package with a design that is readily manufacturable at a low cost.

DESCRIPTION OF RELATED ART

Examples of patents related to the present invention follow; wherein each patent is herein incorporated by reference for related and supporting teachings:

U.S. Pat. No. 5,721,162, is an all silicon monolithic motion sensor with integrated conditioning circuit.

U.S. Pat. No. 5,369,057, is a method of making and sealing a semiconductor device having an air path therethrough.

U.S. Pat. No. 5,831,162, is a silicon micromachined motion sensor.

The foregoing patents reflects the state of the art of which the applicant is aware and are tendered with the view toward discharging applicants' acknowledged duty of candor in disclosing information that may be pertinent in the examination of this application. It is respectfully stipulated, however, that these patents do not teach or render obvious, singly or when considered in combination, applicants' claimed invention.

SUMMARY OF THE PREFERRED EMBODIMENT(S)

It is a feature of the invention to provide a hermetic multilayered ceramic package having a cavity that is bonded to a micromachined semiconductor device.

A further feature of the invention is to provide a semiconductor package for containing a micromachined semiconductor device, including a first substrate having a cavity located therein. The micromachined semiconductor device located adjacent the first substrate. A second substrate is located adjacent to the first substrate. A third substrate located adjacent the second substrate. Several vias extend through the first, second and third substrates. Several conductor lines are located on the first and second substrate and are electrically connected to the vias. An electrical connection mechanism is located between the vias and the micromachined semiconductor device, for electrically connecting the vias to the semiconductor device. A hermetic sealing mechanism is located between the micromachined semiconductor device and the first substrate for hermetically sealing the micromachined semiconductor device. The electrical connection mechanism has several bond pads that are located on the micromachined semiconductor and several solder joints that are connected between the bond pads and the vias.

A further feature of the invention is to provide a semiconductor package for containing micromachined semiconductor devices, including a low temperature co-fired ceramic assembly that has a cavity and a top and bottom surface. Several vias extend between the top and bottom surfaces and several solder spheres are located on the top surface and are electrically connected to the vias. A micromachined semiconductor device abuts the bottom surface and covers the cavity such that a movable portion of the micromachined semiconductor device is unconstrained to move within the cavity. An electrical connection mechanism is located between the vias and the micromachined semiconductor device, for electrically connecting the vias to the semiconductor device. A seal ring is located between the micromachined semiconductor device and the first substrate assembly for hermetically sealing the micromachined semiconductor device.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Figure 1:
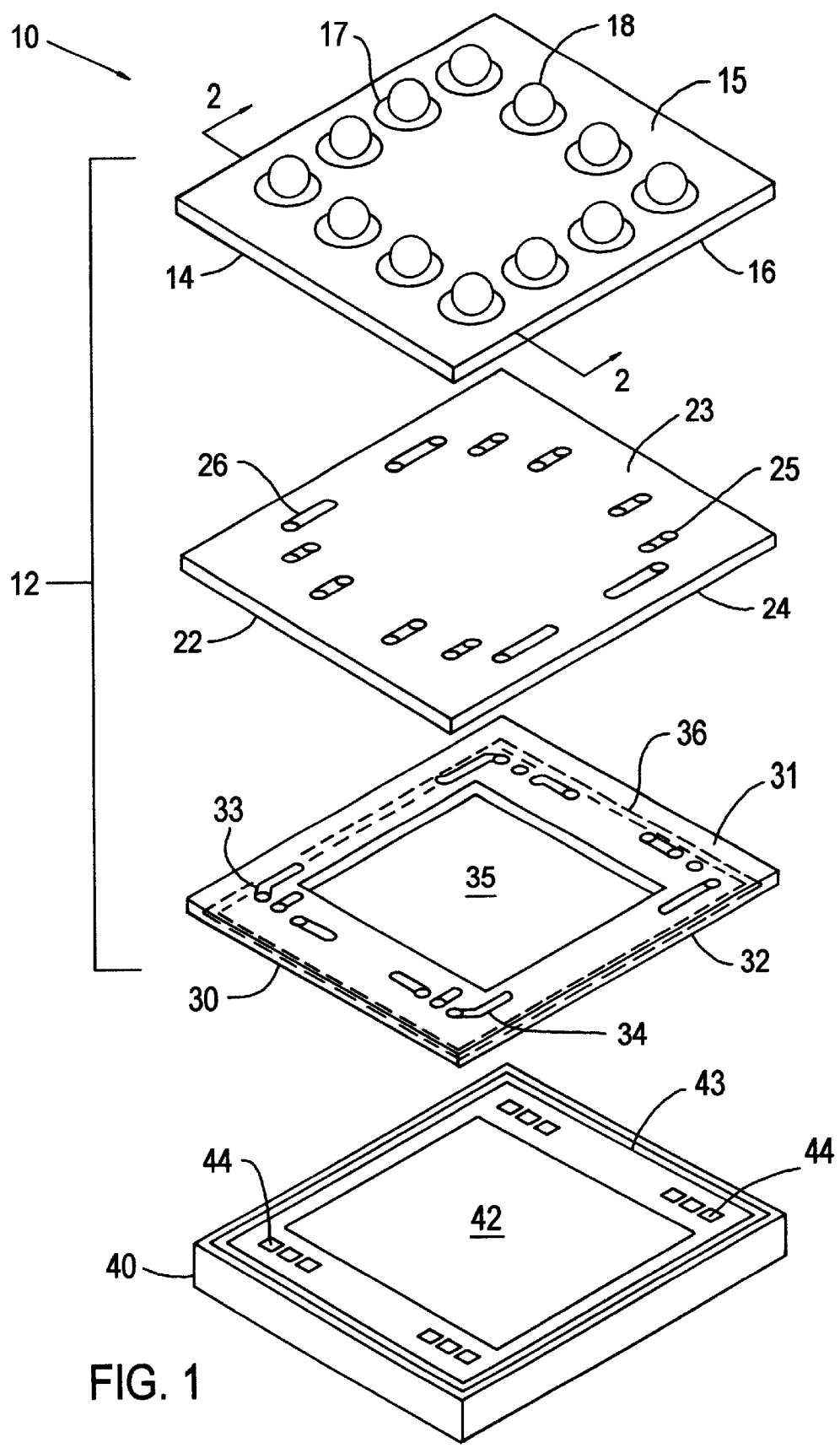
FIG. 1 is an exploded view of a flip chip package for micromachined semiconductors.
Figure 2:
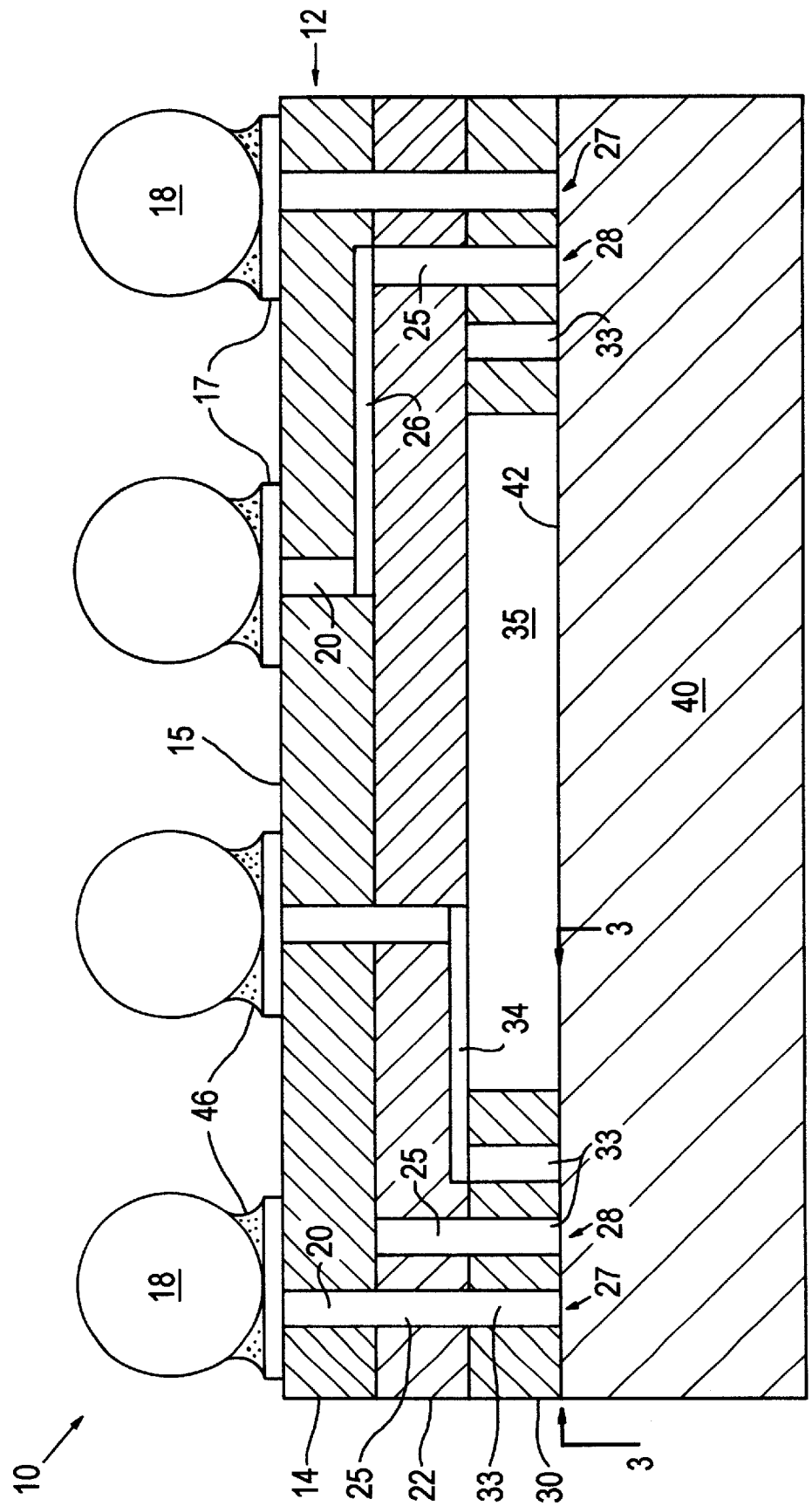
FIG. 2 is a cross-sectional view of FIG. 1.
Figure 3:
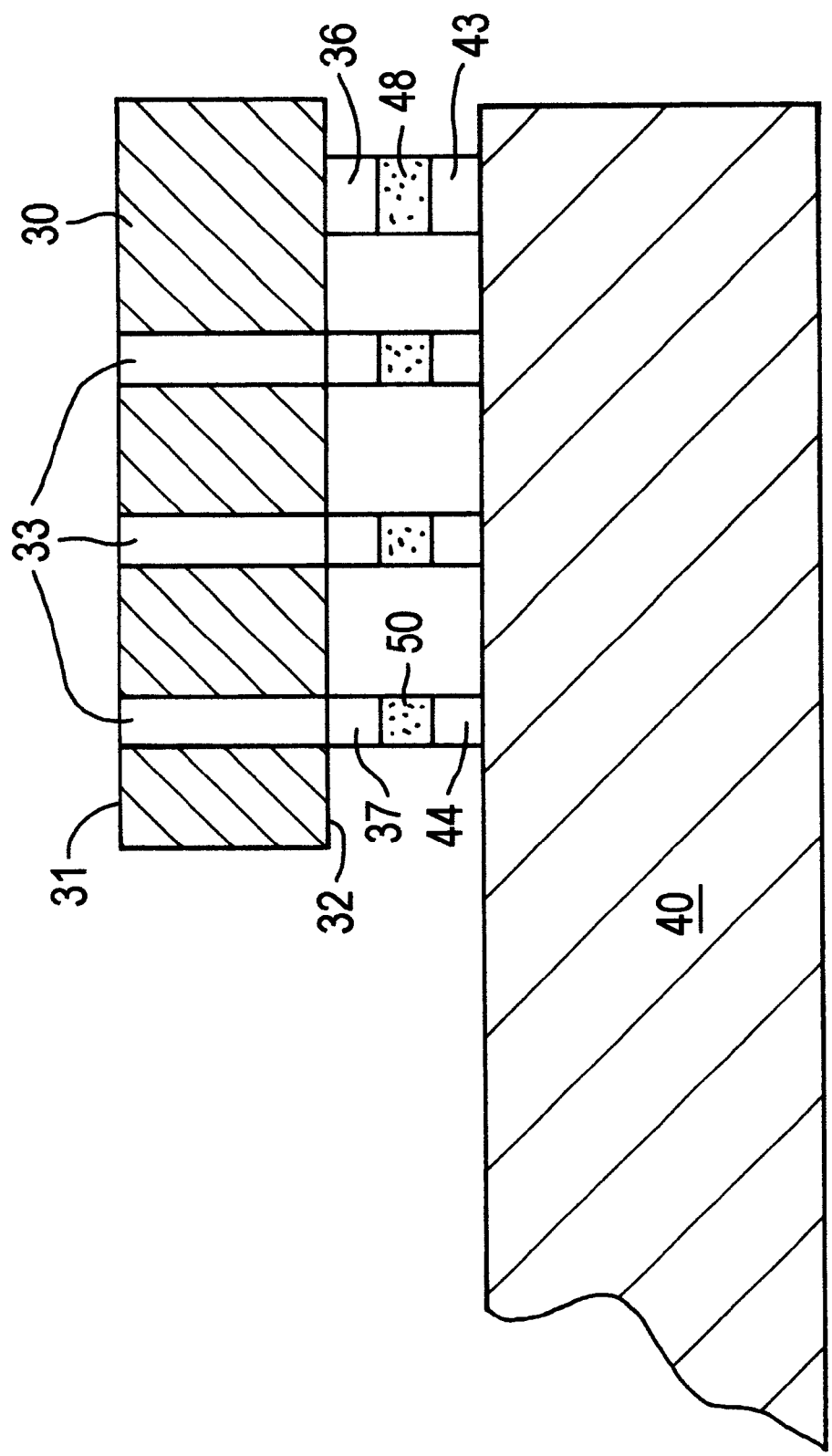
FIG. 3 is a partial view showing details of the ceramic to semiconductor bonds and seal.

Referring to FIGS. 1, 2 and 3, a flip chip package for micromachined semiconductors 10 is shown. First, second and third planar low temperature cofired ceramic (LTCC) layers or substrates 30, 22 and 14, respectively are shown stacked on top of each other. Ceramic substrates or layers 30, 22 and 14 form a ceramic assembly 12. LTCC substrates 30, 22 and 14 are conventional LTCC tapes that are commercially available and well known in the art. Third low temperature cofired ceramic (LTCC) substrate 14 has cylindrical vias 20 that contain an electrically conductive material. The vias are punched in the LTCC material in the green state and then screen filled with a commercially available conventional thick film material. Ceramic substrate 14 has an upper surface 15 and a lower surface 16. Vias 20 extend between surfaces 15 and 16. Solder sphere bond pads 17 are located on upper surface 15 and are electrically connected to vias 20. Bond pads 17 are formed from conventional thick film conductor materials. Solder spheres 18 are connected to bond pads 17 by a reflowed solder paste 46 that is screen printed onto pads 17. Solder spheres 18 are used to electrically connect to another electrical circuit (not shown) that typically would be on an external printed circuit board (not shown).

Similarly, second ceramic substrate 22 has a top surface 23 and a bottom surface 24. Vias 25 extend through substrate 22 and are filled with an electrically conductive material. Vias 25 are cylindrical shaped. Conductor lines 26 are placed on upper surface 23 and are used to route an electrical signal between vias 25 in substrate 22 and vias 20 in substrate 14. Conductor lines 26 are formed from conventional thick film conductor materials.

First ceramic substrate 30 has a top surface 31 and a bottom surface 32. Vias 33 extend through substrate 30 and are filled with an electrically conductive material. Conductor lines 34 are placed on upper surface 31 and are used to route an electrical signal between vias 33 in substrate 30 and vias 25 in substrate 22. Conductor lines 34 are formed from conventional thick film conductor materials. Ceramic substrate 30 has a cavity 35 located in the center. A metal seal ring 36 is located around the peripheral edge of substrate 30 on bottom surface 32. Metal seal ring 36 is a screen printed thick film conductor.

Vias 20, 25 and 33 can be stacked on top of each other or may be staggered depending upon which configuration would give optimal wiring density. If the vias are stacked on top of each other, they become electrically and mechanically connected to each other during processing. Vias 20, 25 and 33 can be stacked on top of each other to form a composite via 27. Similarly, vias 25 and 33 can be stacked to form a composite via 28.

A micromachined semiconductors device (MEMS) or die 40 has an active micromachined area 42 located in the center of the die. Area 42 moves during operation of semiconductor device 40 and must not be constrained or touched by external devices if it is to function properly. Area 42 is located below cavity 35 such that no part of ceramic assembly 12 contacts the active area 42. Semiconductor device 40 has a die side seal ring 43 located around its outer periphery and several bond pads or sites 44 also located toward outer edges of device 40. Micromachined semiconductors devices (MEMS) are used to obtain information in electrical signal form about mechanical forces or movements. Examples of MEMS are devices for sensing tilt, acceleration, strain and pressure. Micromachined semiconductors devices (MEMS) are commercially available from Silicon Designs Inc. and LucasNova Sensor, for example.

Referring to FIG. 3, a partial view showing details of the ceramic to semiconductor bonds and seal is shown. A solder ring 48 is used to make a hermetic seal between metal ring 43 of semiconductor device 40 and metal ring 36 of ceramic substrate 30. Metal ring 36 is a conventional screen printed thick film material that is placed on bottom surface 32. The solder ring 48 my be screen printed solder paste or electroplated solder to metal ring 36 during manufacturing of ceramic assembly 12 and is later reflowed to metal ring 43 of the die 40 during assembly of the silicon die to ceramic assembly 12. A solder joint 50 electrically connects bond pads 44 to bond pads 37 on ceramic substrate 30. Bond pads 37 are electrically connected to vias 33. Again, solder joint 50 is screen printed solder paste or electroplated solder to bond pads 37 during manufacturing of ceramic assembly 12 and is later reflowed to bond pads 44 of die 40 during assembly of the silicon die to ceramic assembly 12.

Figure 4:
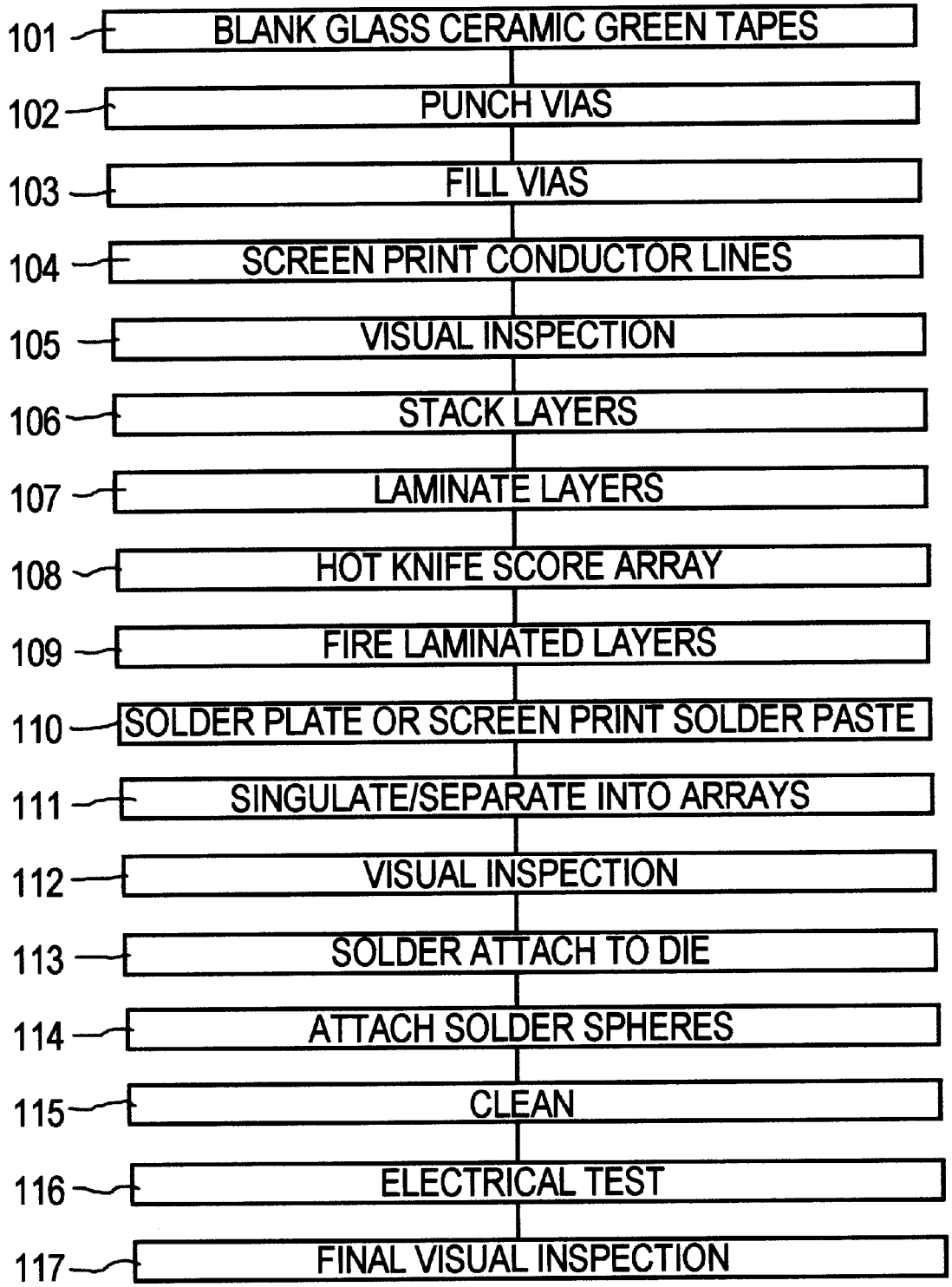
FIG. 4 is a flow chart of the process used to manufacture the flip chip package for micromachined semiconductors.

Referring to FIG. 4, a flow chart of the manufacturing process for the flip chip package for micromachined semiconductors is shown. The first step 101 is to punch the overall shape for substrates 14, 22 and 30 out of a low temperature co-fired ceramic green tape. At step 102, vias 20, 25, and 33 are punched in LTCC substrates 14, 22 and 30 while each of them are in the green state. At step 103, vias 20, 25 and 33 are filled with an electrically conductive material such as a gold, or silver/palladium thick film paste. At step 104, bond pads 17 and 37, circuit lines 26 and 34, and seal ring 36 are screened onto the ceramic substrates. At step 105, ceramic substrates 14, 22 and 30 are inspected for defects. At step 106, ceramic substrates 14, 22 and 30 are then stacked on top of each other to form ceramic assembly 12. At step 107, assembly 12 is laminated under pressure. At step 108, assembly 12 is scored using a hot knife into individual pieces to be snapped apart later. At step 109, ceramic assembly 12 is fired in a oven at approximately 850 degrees centigrade. At step 110, a high temperature solder is either electroplated or screen printed with a solder paste onto bond pads 17, 37 and seal ring 36. At step 111, the ceramic assembly is singulated into individual pieces or packages. At step 112, the individual parts are visually inspected. At step 113, the micromachined semiconductor device 40 is placed onto the ceramic assembly 12 and processed through a reflow furnace to join device 40 to assembly 12. At the same time, solder 48 reflows with the metal seal rings to form a hermetic seal for the micromachined semiconductor device. At step 114, solder spheres 18 are placed onto bond pads 17 and processed through a reflow furnace for joining. At step 115, package 10 is cleaned with a solvent. At step 116, package 10 is electrically tested. At step 117, package 10 is given a final visual inspection.

The seal ring 36 and pads 17 and 37 are electroplated with a fluxless solder composition suitable for reflow in an inert atmosphere. The reflow furnace uses a fluxless inert high temperature solder process. MEMS package 10 can then be attached to ceramic, printed circuit boards or flexible laminate type substrates using conventional ball grid array attach processing.

Remarks on the Preferred Embodiment

The LTCC structure of the present invention provides a solution to both hermetically sealing of the die surface as well as offering a routing medium to allow for flip chip attachment. LTCC materials are suitable for this approach because they demonstrate good mechanical and chemical stability, good thermal conductivity and a coefficient of linear expansion close to that of silicon. In addition, the LTCC materials consisting of glass and ceramic demonstrates excellent flatness and can utilize a low resistivity thick film conductor material such as Au, Ag, and/or PdAg.

Variations of the Preferred Embodiment(s)

One of ordinary skill in the arts of Low Temperature Co-fired Ceramic and electronic packaging design, will realize many advantages from using the preferred embodiment. Further, one of ordinary skill in the art of making ceramic electronic packaging will realize that there are many different ways of accomplishing the preferred embodiment.

Even though the embodiment discusses the use of low temperature co-fired ceramics, other ceramics could be used such as high temperature ceramics.

It was shown that a solder ring 48 was used to hermetically seal assembly 10. It is contemplated to omit solder ring 48. It is also contemplated that an adhesive could be used if a non-hermetic seal is required.

Even though It was shown that thick film materials were used to fabricate the vias and conductor lines. It is contemplated that thin film process or other processes be used to fabricate the vias conductor lines, and bond pads.

It was shown that the semiconductor device was a micromachined semiconductor device; however, other semiconductor devices could be used such as integrated circuits, for example.

It was shown that solder was electroplated and then reflowed during assembly. A variation of the process may use reflowed solder paste.

The embodiment showed the use of solder spheres 18 to connect to an external electrical circuit. It is contemplated to use metal pins or leads or other types of connectors to connect to an external electrical circuit.

It was shown that the ceramic assembly 12 had three substrates. It is possible for assembly 12 to have two substrates or more than three substrates.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A semiconductor package for containing a micromachined semiconductor device, comprising:

a) a first substrate having a cavity located therein, the micromachined semiconductor device located adjacent the first substrate;

b) a second substrate, located adjacent the first substrate;

c) a third substrate, located adjacent the second substrate;

d) a plurality of vias, extending through the first, second and third substrates;

e) a plurality of conductor lines, located on the first and second substrate and electrically connected to the vias;

f) electrical connection means, located between the vias and the micromachined semiconductor device, for electrically connecting the vias to the semiconductor device; and g) a solder ring, located between the micromachined semiconductor device and the first substrate for hermetically sealing the micromachined semiconductor device.

2. The semiconductor package according to claim 1, wherein the electrical connection means includes:

a) a plurality of bond pads located on the micromachined semiconductor; and b) a plurality of solder joints connected between the bond pads and the vias.

3. The semiconductor package according to claim 1, wherein the substrate is a low temperature co-fired ceramic.

4. The semiconductor package according to claim 1, wherein a plurality of solder spheres are located on the third substrate and connected to the vias.

* * * * *